United States Patent [19]

Mahulikar

[11] Patent Number: 4,715,892
[45] Date of Patent: Dec. 29, 1987

[54] CERMET SUBSTRATE WITH GLASS ADHESION COMPONENT

[75] Inventor: Deepak Mahulikar, Meriden, Conn.

[73] Assignee: Olin Corporation, New Haven, Conn.

[21] Appl. No.: 922,271

[22] Filed: Oct. 30, 1986

Related U.S. Application Data

[63] Continuation-in-part of Ser. No. 838,866, Mar. 12, 1986.

[51] Int. Cl.[4] ............................................. C22C 29/12
[52] U.S. Cl. ...................................... 75/233; 75/232; 75/234; 75/235; 75/237; 75/238; 75/244; 264/60; 264/125; 264/332; 419/13; 419/17; 419/19; 428/552; 428/558; 428/564; 428/570
[58] Field of Search ................. 75/232, 233, 234, 235, 75/237, 238, 244; 419/19, 13, 17; 264/60, 125, 332; 428/552, 558, 564, 570

[56] References Cited

U.S. PATENT DOCUMENTS 3,725,091  4/1973  Chyung et al. ........................ 419/19
3,963,449  6/1976  Seki et al. ............................ 419/19
4,569,692  2/1986  Butt ..................................... 75/235

OTHER PUBLICATIONS

"A Method for Fabrication of Aluminum–Alumina Composites" by B. F. Quigley, et al., *American Society for Metals and the Metallurgical Society of AIME*, Metallurgical Transactions A, vol. 13A, Jan. 1982.

Primary Examiner—Stephen J. Lechert, Jr.
Attorney, Agent, or Firm—Paul Weinstein

[57] ABSTRACT

The present invention is directed to a cermet material comprising a matrix of metal or alloy with ceramic particles distributed therein. The cermet includes a glass binder for bonding between the metal or alloy and the ceramic particles.

29 Claims, 1 Drawing Figure

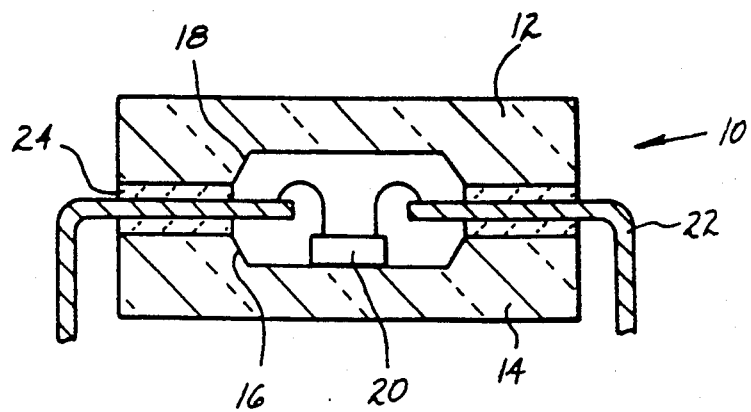

CERMET SUBSTRATE WITH GLASS ADHESION COMPONENT

This case is a Continuation-In-Part of Ser. No. 838,866, filed Mar. 12, 1986.

This application relates to U.S. Pat. No. 4,569,692, entitled "Low Thermal Expansivity and High Thermal Conductivity Substrate" by S. H. Butt and U.S. patent application No. 838,967, entitled "Cermet Substrate With Spinel Adhesion Component" by M. J. Pryor et al., filed Mar. 12, 1986; U.S. patent application Ser. No. 924,968, file date 10-30-86, entitled CERAMIC-GLASS-METAL COMPOSITE by N. N. SinghDeo et al.; U.S. patent application Ser. No. 924,970, file date 10-30-86, entitled ELECTRONIC PACKAGING OF COMPONENTS INCORPORATING A CERAMIC-GLASS-METAL COMPOSITE by N. N. SinghDeo et al; U.S. patent application Ser. No. 924,959, file date 10-30-86, entitled PRODUCTS FORMED OF CERAMIC-GLASS-METAL COMPOSITES, by N. N. SinghDeo et al.; U.S. patent application Ser. No. 707,636, entitled PIN GRID ARRAY, by M. J. Pryor (now abandoned) and U.S. patent application Ser. No. 811,906, entitled MULTILAYER AND PIN GRID ARRAYS, by M. J. Pryor.

While the invention is subject to a wide range of applications, it is especially suited for use as a substrate for microelectronics. The invention is primarily directed to bonding together materials having different thermal expansivities and thermal conductivities to form a coherent composite with improved rigidity and thermal performance.

Low expansivity materials are widely used in the microelectronic industry as substrate materials for semiconductor packages, multi-device hybrid circuit packages, chip carriers and printed circuit boards. The latter applications are particularly useful when the coefficient of thermal expansion of the substrate is critical, i.e. when silicon chips or low expansivity leadless chip carriers are mounted directly to the substrate.

In many instances, state of the art, low expansivity, ceramic and metallic substrate materials may be replaced by relatively high expansivity metals. Generally, high expansivity metallic materials are used in combination with appropriately selected high expansivity glasses or organic adherents. The mismatch in the coefficient of thermal expansion (CTE) between these combinations of materials and the low CTE silicon based microelectronic components is accommodated by mounting systems such as adhesives or solders which prevent the development of unacceptably high thermal stresses within the typically fragile and brittle semiconductor components. An example of such a die attach system is disclosed in U.S. patent application Ser. No. 826,808, filed Feb. 10, 1986 by M. J. Pryor et al. for "Semiconductor Die Attach System". However, it may not be feasible to provide component mounting systems which can accommodate the potential thermal stresses developed due to the significant mismatch between high CTE metal substrates and the low CTE semiconductor chips. To better appreciate the advantages of the unique materials of the present invention, the limitations of conventional substrate materials are enumerated in the following text.

Alumina ceramics are presently the most widely used of the substrate materials. There is a moderate mismatch between the coefficients of thermal expansion of alumina and the semiconductor chip. This mismatch generally does not create unacceptably high stresses on a chip mounted to an alumina substrate when subjected to thermal cycling. The mismatch is usually acceptable even when the chip sizes are quite large or when the chip is rigidly adhered to the substrate. Alumina ceramics are particularly attractive since they are less costly than most other low expansivity substrate materials. However, there are a number of drawbacks to alumina such as poor tolerance control, poor thermal conductivity, i.e. in the range of about 10 to about 20 watts per meter kelvin (W/m-°K.). Also, manufacturing capabilities limit alumina substrate areas to less than about 50 sq. in.

Beryllia ceramics, having a rather high thermal conductivity of about 190 W/m-°K., replace alumina ceramics in special applications. The inherent high cost of beryllium results in these substrates being very expensive. A further disadvantage of beryllia substrates is its toxicity requiring cautious handling and very careful dust control. However, even with high material costs, high processing costs and toxicity control problems, beryllia substrates are often used when enhanced thermal conductivity is required.

Molybdenum strip metal, having a thermal conductivity of about 142 W/m-°K., is sometimes used as a substrate material, particularly in hybrid circuit packages. Although expensive and difficult to process, molybdenum does provide high thermal conductivity in association with a low coefficient of thermal expansion (CTE), i.e. about $49 \times 10^{-7}$ in/in/°C. A serious drawback to the use of molybdenum components is the particular difficulty in processing because of its poor oxidation resistance.

Clad metals for low expansivity substrates generally include a high conductivity, high thermal expansivity copper or copper alloy clad to a very low thermal expansivity nickel-iron alloy (such as INVAR) core. The resulting composite has a coefficient of thermal expansion comparable to that of alumina and beryllia ceramics. The purpose of cladding with copper or copper alloy is to improve the relatively poor thermal conductivity of nickel-iron alloys. However, the improved thermal conductivity is primarily in a plane extending through the length and width of the substrate. At the same time, thermal conductivity through the thickness of the composite metal, primarily comprising the nickel-iron alloy core, remains relatively low. The cost of the nickel-iron alloys and the relatively costly process involved in manufacturing clad metals results in these substrate materials being relatively expensive although still less costly than comparable beryllia or molybdenum substrates.

The present invention is directed to composite materials called cermets. As the term indicates, they include mixtures of metals and ceramics. The advantage of this material over comparably sized metal substrate is its increased rigidity and lighter weight. As compared to ceramic substrates, it has a much higher coefficient of thermal expansion and thermal conductivity and can be electrically conductive. Also, the cermets are fabricated at a much lower temperature than that required for ceramic sintering, i.e. about 1600° C. and the processing cost is typically lower. Further, the CTE and the thermal conductivity of the cermet can be selected over a relatively large range of values. The problem has been that, up until now, these materials were not easily bonded together to form a rigid structure as required for electronic applications.

A process of producing aluminum-alumina composites has been described in an article entitled "A method for Fabrication of Aluminum-Alumina Composites" by B. F. Quigley et. al., American Society For Metals And The Metallurgical Society Of AIME, Metallurgical Transactions A, Volume 13A, Jan. 1982. This article discloses that alumina fibers can be incorporated in Al-Mg matrices and that complete wetting and bond formation are achieved. The process incorporates casting technology whereby the ceramic fibers are mixed into molten Al-Mg. Then about 50 to about 70 percent of the aluminum is squeezed out of the mixture through a ceramic filter. The resulting mixture has a maximum of about 23 vol. % of alumina particles in a matrix of Al-Mg. The article also stated that substantial fiber breakage occurred when the fibers in the starting material were at a level of about 10 to 20 vol. %. Therefore, the breakage was kept to a minimum by compressing composite material containing fibers in the range of 5 to 10 vol. percent. This article describes a process which is quite different from that of the present invention. First of all, the present invention uses powder metallurgy technology and is thereby able to achieve substantially higher percent volumes of ceramic particles within the alloy matrix. These higher volumes are extremely important for adjusting the coefficient of thermal expansion of the mixture to be compatible with that of copper alloy material which is typically used for leadframe construction in semiconductor packaging applications. Also, the amount of alloying particles being added to the aluminum is within a restricted range in order that the thermal conductivity of the final composite is high. The size of the ceramic particles is also kept very small in order that the resulting composite will have a smooth finish in order that it be suitable for electronic applications.

It is a problem underlying the present invention to manufacture a rigid cermet having a relatively high coefficient of thermal expansion and a relatively high thermal conductivity.

It is an advantage of the present invention to provide a composite which obviates one or more of the limitations and disadvantages of the described prior arrangements.

It is a further object of the present invention to provide a composite and method of forming the composite which has a CTE that is closely matched to that of a metallic leadframe.

It is a still further advantage of the present invention to provide a composite and method of forming the composite which is adapted to be a substrate that is both rigid and able to withstand thermal shock resistance.

It is another advantage of the present invention to provide a composite and method of forming the composite which is highly thermally conductive.

It is a yet further advantage of the present invention to provide a composite and method of forming the composite which is relatively inexpensive to manufacture.

Accordingly, there has been provided a cermet material which is adapted for use as a semiconductor substrate. The cermet is a composite preferably formed using powder technology procedures. The composite consists essentially of a mixture of from about 25 to about 80 volume % and preferably from about 40 to about 60 volume % of a metal or alloy, from an effective amount up to about 10 volume % of binder for enhancing bonding between the metal or alloy and the ceramic particles, and the balance essentially ceramic particles. The composite material has a matrix comprising the metal or alloy with the binder and the ceramic particles distributed therein. In a second embodiment, the composite has a matrix comprising metal or alloy with glass coated ceramic particles distributed therein.

IN THE DRAWING

The FIGURE is a semiconductor package formed of a cermet base and cover in accordance with the present invention.

The present invention is particularly directed to cermets having a relatively high coefficient of thermal expansion and a relatively high thermal conductivity. These cermets are manufactured from relatively inexpensive materials using powder metallurgy techniques. The resulting cermets are adapted for use in numerous engineered ceramic applications such as substrates for semiconductor devices, hybrid packages or rigid printed circuit boards. The basic concept involves mixing ceramic particles with metal or alloy particles, such as aluminum or aluminum alloy particles and heat treating the mixture so that the resulting cermet has the ceramic particles distributed within an aluminum matrix. The ceramic material has a low coefficient of thermal expansion, a high elastic modulus and generally exhibits poor thermal conductivity. By contrast, the aluminum is a highly thermal conductive material with a high coefficient of thermal expansion. The production of this cermet is severely limited by the inability of liquid aluminum to wet the ceramic particles. The present invention is directed to a new method of fabricating aluminum or aluminum alloy ceramic composites which involves the addition of binder to the aluminum or aluminum alloy matrix for enhancing bonding between the aluminum or aluminum alloy particles and the ceramic particles. This binder forms a spinel of the binder and the ceramic at the interface between the matrix and the ceramic particles to chemically bond the ceramic particles within the aluminum alloy matrix.

The ceramic particles are preferably aluminum oxide ($Al_2O_3$) but may be any other ceramic particles such as for example AlN and $Si_3N_4$ and mixtures thereof. The $Al_2O_3$ (alumina) particles are particularly desirable because they are readily available, inexpensive and have a coefficient of thermal expansion and compressive elastic modulus in a desired range. The ceramic particles have a size between about 10 to about 400 microns and preferably between about 15 to about 25 microns. The upper limit of the ceramic particles is chosen because the finished product requires a relatively smooth finish in order to meet the standards for electronic packaging. If the composite were used for an application other than electronic packaging, the ceramic particles may be of any size greater than about 10 microns. The volume % of the ceramic particles is determined after the volume % of the aluminum and the binder has been selected so that the final composite has essentially up to about 10 volume % of the binder. Typically, the amount of ceramic is selected to adjust the final composite in accordance with the required coefficient of thermal expansion. As the amount of ceramic is reduced, the coefficient of thermal expansion of the composite is raised.

The composite material also contains from about 30 to about 65 volume % of metal or alloy particles preferably consisting essentially of aluminum and aluminum alloy. Preferably, the aluminum or aluminum alloy make up from about 40 to about 60 volume % of the composite. This volume % is selected in order that the final composite material has a relatively high coefficient of thermal expansion of between about $140 \times 10^{-7}$ to about $170 \times 10^{-7}$ in/in/°C. and preferably between about $150 \times 10^{-7}$ to $165 \times 10^{-7}$ in/in/°C. This high volume % of aluminum or aluminum alloy may result in the final composite being electrically conductive. This is advantageous to provide an EMI shield and to prevent static shock.

The aluminum or aluminum alloy particles are sized between about 3 to about 25 microns. Preferably, the aluminum or aluminum alloy particles are sized from about 5 to about 10 microns. The lower size limit of the aluminum or aluminum alloy particles is established in order to maintain the oxide addition at a low level. Very small particles, such as below about 5 microns, are easily oxidized and result in an undesirably high oxygen content in the mixture. At the same time, it is preferably to use relatively small aluminum or aluminum alloy particles in order that the final density of the composite is relatively high such as above about 96% of the theoretical density. This is important in applications requiring hermetic components where significant porosity can not be tolerated. The aluminum itself has a coefficient of thermal expansion of about $230 \times 10^{-7}$ in/in/°C. and a thermal conductivity of about 270 W/m-°K.

The aluminum or aluminum alloy particles are selected to be smaller than the ceramic particles because the aluminum is deformable while ceramic is relatively undeformable. This can be understood from the following remarks. Assuming that a mixture of powder is formed of spheres of one size, the interstices or voids between adjacent spheres allow a maximum of 65% theoretical packing without any deformation. If a mixture of powder comprising two different materials are packed together and one of the materials is composed of particles which are larger or coarser than the other, the finer particles can be disposed in the interstices between the larger particles. In the present case, it is preferably that the larger particles are ceramic non-deformable particles. Then the smaller aluminum or aluminum alloy particles are deformable and can be packed into the interstices to achieve maximum densification.

The composite of an aluminum or aluminum alloy matrix containing high strength ceramic particles is ideal for substrate applications. However, production of this composite is severely limited by the inability of the liquid aluminum to wet the ceramic fibers. The absence of adhesion within this type of system was illustrated by the following test. Five micron size aluminum powder was thoroughly mixed with about 30 micron size @-Al$_2$O$_3$. The aluminum powder made up approximately 40 volume % of the mixture and the balance was the @-Al$_2$O$_3$. The powder was then compacted into cylinders using about 15 to about 25 tons of pressure. The green density of the compact was about 88%. The compacts were then degassed at about 400° C. and sintered at about 600° C. for 24 hours. The sintered density of the compact was about 92%. The compressive elastic modulus of the sintered compact was about $7 \times 10^6$ psi. Fractographic studies were carried out and indicated that no Al-Al$_2$O$_3$ adhesion was achieved. The inability for the liquid metal to wet the alumina particles has previously been indicated in the literature as mentioned in the article by Quigley et al. described in the background of this invention.

The present invention adds an effective amount up to about 10 volume % of binder for enhancing bonding between the aluminum alloy matrix and the ceramic particles. The binder may be added in particle form sized between about 3 to about 25 microns. Preferably the particles of binder are sized from about 5 to about 10 microns. The binders are preferably selected from the group consisting of Mg, Li, Cr, Ca, Be, MgO and mixtures thereof. The effective ranges in volume % are thought to be about 0.5 to about 10 volume % of Mg and preferably about 2 to 6 volume % of Mg. The effective ranges of the remaining components are about 1 to about 5 volume % Li, about 0.05 to about 3 volume % Cr, about 0.05 to about 1 volume % Ca, about 0.05 to about 0.5 volume % Be, and about 1 to about 5 volume % MgO.

The magnesium is thought to be the preferred addition to the aluminum because it is not reactive with the aluminum and is relatively inexpensive. The magnesium diffuses into the aluminum and reduced its thermal conductivity by a significant amount. For example, referring to Chart I, an 8% addition of magnesium significantly lowers the thermal conductivity as compared with a 1% addition of magnesium to the aluminum.

CHART I

| Material | Thermal Conductivity Watts/Meter °K. |
| --- | --- |
| Aluminum | 270 |
| Ceramic | 10–20 |
| Copper | 380 |
| Copper Alloy (CDA 72400) | 45 |
| Aluminum + 1% Mg | 220 |
| Aluminum + 8% Mg | 140 |

It is clear from Chart I that the amount of magnesium added to mixture is preferably kept low in order to increase the thermal conductivity of the cermet material. The final thermal conductivity of the cermet material is between about 40 to 120 W/m-°K. Preferably, the range is about 50 to about 100 W/m-°K. and most preferably between about 60 and about 80 W/m-°K.

Another important characteristic of the cermet material is its high coefficient of thermal expansion which is in the range of about $140 \times 10^{-7}$ to about $170 \times 10^{-7}$ in/in/°C., preferably in the range of about $140 \times 10^{-7}$ to about $170 \times 10^{-7}$ in/in/°C. and most preferably in the range of about $150 \times 10^{-7}$ to about $165 \times 10^{-7}$ in/in/°C. This range may be selected to prevent any significant CTE mismatch to copper alloy material which is the preferred material for leadframe applications. For example, the coefficient of thermal expansion of CDA 72400 is about $170 \times 10^{-7}$ in/in/°C.

The binder creates a chemical bond at the interface of the particulate ceramic and the aluminum alloy during solid or liquid phase sintering. The bond is through a spinel such as MgO.Al$_2$O$_3$. The strong chemical bond formed by the spinel bonding to both the alumina and the aluminum magnesium alloy enables transfer of either mechanical or thermal loads so that the composite achieves the rule of mixture properties.

The final cermet or composite exhibits the beneficial combination of high compressive elastic modulus, high thermal conductivity and high coefficient of thermal expansion which are particularly important in semiconductor applications. An important characteristic of the cermet is its high compressive modulus. The final compact has a compressive modulus of at least about $20 \times 10^6$ psi. This high compressive modulus results in excellent mechanical integrity of the final cermet and rigidity of a semiconductor package when the material is employed as shown for example in the FIGURE.

The process of forming the cermet of the present invention preferably applies powder metallurgy technology. A mixture is formed of from about 25 to about 80 volume % of aluminum or aluminum alloy particles having a size from about 3 to about 100 microns. Then an effective amount up to about 10 volume % of binder, in the form of particles sized between about 3 to about 25 microns, for enhancing bonding between the aluminum or aluminum particles and the ceramic particles are added. The binder is selected from the group consisting of Mg, Li, Cr, Ca, Be, MgO and mixtures thereof. Then the balance of the mixture is added to form 100 volume %. The balance comprises ceramic particles having a size from about 10 to about 100 microns. The ceramic particles are selected from the group consisting of AlN, $Si_3N_4$, $Al_2O_3$ and mixtures thereof. The mixture is thoroughly blended and compacted using a pressure of between about $15 \times 10^3$ to about $100 \times 10^3$ psi and preferably between about $40 \times 10^3$ to about $60 \times 10^3$ psi. Then, the compact is preferably degassed at a temperature of about 300° C. to about 650° C. for about 1 hour. This step is typically required because aluminum powders are usually coated with a lubricant such as stearic acid which must be vaporized and removed from the compact. Finally, the compact is heat treated by a process such as sintering at a temperature range of about 600° C. to about 750° C. for about 8 to about 100 hours. The sintering may be done in the solid state below about 660° C. and in the semi-solid state at a temperature above about 660° C. In either case, it is preferably accomplished within 24 hours and within an inert or reducing atmosphere such as nitrogen, nitrogen- 4% hydrogen or argon. When the sintering is done in the semi-solid state, the binder may be added as MgO.

An example of the process for forming a cermet includes mixing 30 to 100 micron size @-$Al_2O_3$ powder with 5 micron size magnesium powder. The mixture was then blended with three micron size aluminum powder. The volume fraction of the aluminum powder was about 35% and that of the magnesium powder was about 6%, and the remainder $Al_2O_3$. The mixture was compacted using about 30,000 pounds of pressure. Then the compacts were degassed and sintered at about 600° C. for 24 hours. The compressive elastic modulus was measured as being between about $24 \times 10^6$ to about $27 \times 10^6$ psi. Further processing such as hot pressing or hot forging may be applied to increase densification and improve properties.

Referring to the FIGURE, a semiconductor casing 10 is illustrated. The lid 12 and the base 14 are formed of a cermet in accordance with the present invention. A cavity 16 and 18 of any desired shape may be formed in the base and lid to accommodate the semiconductor device 20. A leadframe 22, preferably copper alloy, is disposed between the base and cover. A glass 24 having a high coefficient of thermal expansion may preferably be used to hermetically seal the package 10. A suitable glass may be lead borate type sealing glasses including additives of either calcium fluoride or barium fluoride to increase the coefficient of thermal expansion to match that of the copper alloy lead frame. Further, it may be desirable to add small amounts of copper oxide to the glass to strengthen the bond to the copper alloy leadframe. The modified glass and its application for hermetically sealing a semiconductor casing is set out in U.S. patent application Ser. No. 651,986 to Pryor et al. The leadframe is preferably formed of a copper base alloy such as CDA 72400 which can form a strong bond to the sealing glass and have good softening resistance when exposed to high temperatures. It is also within the terms of the present invention to use other glass sealable alloys such as CDA 63800. Both of these alloys and the glass have a coefficient of thermal expansion in the range of about $160 \times 10^{-7}$ to about $170 \times 10^{-7}$ in/in/°C. This favorably compares to the coefficient of thermal expansion which can be achieved using a cermet formed in accordance with the present invention.

A second embodiment is directed to a cermet using a solder glass binder to form a strong bond between the aluminum and the ceramic particles. This binder is different from the metallic binders described earlier in the specification. The glass is particularly advantageous because it does not alloy with the aluminum matrix and therefore does not reduce the thermal conductivity of the aluminum matrix. Also, the glass can be selected so as to form a final composite material having a wide range of coefficients of thermal expansion.

The glass used for the binder is preferably selected from the group consisting of silicate, lead borate, borosilicate, phosphate, zinc borosilicate, soda-lime-silica, lead silicate, and lead-zinc-borate glasses. Preferably, the glass selected is a borosilicate solder glass of a general composition MO-$B_2O_3$-$SiO_2$, where MO=$Al_2O_3$, BaO, CaO, $ZrO_2$, $Na_2O$, SrO, $K_2O$ and mixtures thereof. The glass is not limited to this group and may include any glass capable of chemically reacting with both the ceramic particles and the metallic particles. The glass may be vitrified or devitrified and have a softening temperature from about 350° to about 1200° C. and, preferably, from between about 350° to about 650° C. The glass is selected to preferably have a coefficient of thermal expansion between about $60 \times 10^{-7}$ to about $170 \times 10^{-7}$ and preferably between about $100 \times 10^{-7}$ to about $150 \times 10^{-7}$ in/in/°C. Typically, the glass is selected with a high coefficient of thermal expansion that is closer to that of the aluminum or aluminum alloy than to that of the ceramic. The glass is preferably provided in particulate form having a size between about 3 to about 25 microns and preferably between about 5 to about 10 microns. However, it is within the terms of the present invention to use the glass with any sized particles since the glass is heated to the liquid state during the binding of the ceramic and glass particles. The glass chemically reacts with both the aluminum and the ceramic in order to form a strong bond which enables transfer of load during mechanical and thermal stress. The bond in the present invention is formed because the aluminum reacts with oxides in the glass and causes an exothermic reaction. Also, the glass has oxides which can dissolve the ceramic and form excellent bonds.

The aluminum or aluminum alloy used in the cermet of the second embodiment is in particle form and is essentially the same as that described earlier in the specification with regard to the aluminum or aluminum alloy of the first embodiment. The aluminum or aluminum particles are sized from about 3 to about 100 microns and preferably from about 3 to about 25 microns. The volume % of the aluminum particles is about 25 to about 80 volume % and preferably from about 40 to about 60 volume %. It is also within the terms of the present invention to replace the aluminum or aluminum alloy with any desired metallic particles that chemically react with the selected glass to form a strong bond. The metallic particles are selected from the group consisting of aluminum, copper, nickel, titanium, chromium, iron, silver, gold and alloys thereof. The invention is not limited to these metals and alloys and may include any metal or alloy particle which chemically bonds to the selected glass.

The ceramic particles are also the same as those described earlier in the specification with regard to the first embodiment. However, the present invention is not limited to those ceramics and may be selected from the group consisting of $Al_2O_3$, SiC, BeO, $TiO_2$, $ZrO_2$, MgO, AlN, $Si_3N_4$, BN and mixtures thereof. Moreover, the present invention may also incorporate any desired ceramic or mixture of ceramics. Preferably, the ceramic particles are sized from between about 10 to about 100 microns, preferably from between about 10 to about 40 microns and most preferably from between about 15 to about 25 microns. The ceramic particles are specifically chosen to be of a larger size than the metallic particles such as the aluminum or aluminum alloy particles.

The preferred process of forming the composite material includes first forming a mixture comprising about 25 to about 80 volume % of metallic particles consisting essentially of aluminum or aluminum alloy, or any desired metallic particles selected from the group consisting of copper, nickel, titanium, chromium, iron, silver, gold and alloys thereof, from an effective amount up to about 10 volume % of binder in the form of particles of any glass such as solder glass for enhancing bonding between said aluminum or aluminum alloy or metallic particles and ceramic particles and the balance essentially ceramic particles. More preferably, the binder in the form of particles of glass makes up from about 1% to about 9 vol. % of the mixture. The particles of solder glass binder are mixed with the ceramic particles so that the ceramic particles are coated with the glass particles. Then, the glass coated ceramic particles are heated to the temperature where the glass is in the liquid condition. The heated glass coated ceramic particles are next cooled to fuse the glass to the ceramic particles. The resulting mixture is then ground to form the glass coated ceramic particles. Next, these glass coated ceramic particles are mixed thoroughly with the metallic material, such as aluminum particles. The mixture is compacted. Finally, the compacted mixture is heat treated at a temperature to either sinter or melt the metallic particle so as to form a matrix comprising a metal or alloy, such as aluminum or aluminum alloy, with the glass coated ceramic particles distributed therein.

The final cermet or composite exhibits the beneficial combination of high compressive elastic modulus, high thermal conductivity and high coefficient of thermal expansion which are particularly important in semiconductor applications. Preferably, the coefficient of thermal expansion is at least about $80 \times 10^{-7}$ in/in/°C., preferably between about $80 \times 10^{-7}$ to about $190 \times 10^{-7}$ in/in/°C. and most preferably between about $140 \times 10^{-7}$ to about $170 \times 10^{-7}$ in/in/°C. The thermal conductivity is at least about 50 W/m-°K. and preferably between about 50 to about 150 W/m-°K. An important characteristic of the cermet is its high compressive elastic modulus. The final compact has a compressive elastic modulus of at least about $20 \times 10^6$ psi. This high compressive modulus results in excellent mechanical integrity of the final cermet and rigidity of a semiconductor package when the material is employed as shown for example in the FIGURE.

The specifics of an exemplary process of forming the cermet of the second embodiment of the invention preferably utilizes powder metallurgy technology. A mixture is formed of from about 25 to about 80 volume % of aluminum or aluminum alloy particles having a size from about 3 to about 100 microns. Then an effective amount up to about 10 volume % of binder in the form of solder glass particles preferably sized between about 3 to about 25 microns for enhancing bonding between the aluminum or aluminum particles and the ceramic particles is added. The glass is preferably selected from the group consisting of silicate, borosilicate, phosphate and zinc borosilicate solder glasses. Then, the balance of the mixture to form 100 volume % is added to the ceramic particles having a size from about 10 to about 100 microns. The ceramic particles are selected from the group consisting of $Al_2O_3$, AlN, $SiC_2$, BeO, $TiO_2$, $ZrO_2$, MgO, BN, $Si_3N_4$ and mixtures thereof.

In carrying out the process, the glass and ceramic particles are first mixed together by any means such as a V-type mixer so that the glass particles surround the ceramic particles. Then, the glass covered ceramic particles are heated to the softening temperature, i.e. between about 350° to about 650° C. so that the glass fuses together and chemically interacts with the ceramic. Then, the glass coated ceramic particles are cooled. The resulting mass of glass coated ceramic particles are then ground to a size of between about 10 to about 100 microns and preferably from 10 to about 40 microns. Next, the glass covered ceramic particles are mixed with the aluminum or aluminum alloy particles. This mixture is then compacted using a pressure of between about $15 \times 10^3$ to about $100 \times 10^3$ psi and preferably between about $40 \times 10^3$ to about $60 \times 10^3$ psi. Prior to latter mixing step, the aluminum powders may be degassed at a temperature of about 300° C. to about 650° C. for about 1 hour. This step is typically required because aluminum powders are usually coated with a lubricant such as stearic acid which must be vaporized and removed from the compact. Note, however, that aluminum particles not requiring removal of any foreign materials may be available and this essentially pure aluminum or aluminum alloy does not require degassing. Finally, the compact is heat treated by a process such as sintering, hot pressing or forging, at a temperature range of about 600° C. to about 750° C. for about 8 to about 100 hours. The sintering may be done in the solid state, i.e. solid state sintering, below about 660° C. and in the semi-solid state, i.e. liquid state sintering, at a temperature above about 660° C. In either case, it is preferably accomplished within 24 hours and within an inert or reducing atmosphere such as nitrogen, nitrogen-4% hydrogen or argon.

An example of the process for forming a cermet included mixing about 30 to about 100 micron sized @-$Al_2O_3$ powder with about 5 micron PbO glass (softening point around 400° C.) in a V-type mixer. The resulting glass coated alumina particles were then mixed with 3 micron aluminum powder. The final volume fractions were about 32% aluminum, 8% glass and 60% $Al_2O_3$. The mixture was compacted at about 10 to about 15 ksi and hot pressed at about 600° at about 10 ksi. The final density of the composite was about 94%. The compressive modulus was measured as being about $25 \times 10^6$ to about $30 \times 10^6$ psi.

A second process of forming the cermet of the second embodiment is essentially the same as the process described earlier in the specification except that the metallic particles such as aluminum or aluminum alloy are mixed in with the glass covered ceramic particles prior to heating. In this process, the particles of glass binder are first mixed with the ceramic particles so that the ceramic particles are coated with the glass particles. Then, the glass coated ceramic particles are mixed with the metallic particles, i.e. the aluminum or aluminum alloy particles. This mixture is blended and compacted using a pressure in the range previously set out. Finally, the compact, with aluminum or aluminum alloy, is heat treated within a temperature range of about 600° to about 700° C. for about 8 to 100 hours. The heat treatment may be accomplished either in the solid state below about 660° C. or in the semi-solid state at a temperature above about 660° C. In either case it is preferably accomplished within 24 hours and within inert and reducing atmosphere such as nitrogen, nitrogen-4% hydrogen or argon.

The resulting cermet from either process set out to produce the second embodiment may be used to form the lid 12 and the base 14 of the semiconductor casing 10 illustrated in the FIGURE. The leadframe 22 is disposed between the base and cover and hermetically sealed with a glass 24 having a coefficient of thermal expansion which is preferably high and relatively close to that of the leadframe material. The sealing glass may be a lead borate type sealing glass including additives such as calcium fluoride or barium fluoride to increase the coefficient of thermal expansion to match that of the leadframe 22 which is preferably constructed of a copper alloy material. As mentioned earlier in the specification, the glass and its application is set out in U.S. patent application No. 651,986 to Pryor et al.

The cermet of the present invention may also be used for any desired application suitable for engineering ceramics, bio-ceramics and electro-ceramics.

The patent, patent applications and article set forth in this application are intended to be incorporated in their entireties by reference herein.

It is apparent that there has been provided in accordance with this invention a cermet substrate with glass adhesion component which satisfies the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

What is claimed:

1. The process of forming a composite material, comprising the steps of:
    providing a mixture of from about 25 to about 80 volume % of metallic material in the form of particles, from an effective amount up to about 10 volume % of binder in the form of particles of glass, and the balance essentially ceramic particles;
    mixing said glass particles with said ceramic particles whereby said ceramic particles are coated with said glass particles;
    mixing the glass coated ceramic particles with said metallic particles;
    compacting said mixture; and heat treating the compacted mixture to form a matrix comprising the metallic material with said glass coated ceramic particles distributed within said matrix.

2. The process of claim 1 further including the steps of:
    selecting the metallic particles having a size from about 3 to about 100 microns;
    selecting said glass particles having a size from about 3 to about 25 microns;
    selecting said ceramic particles having a size from about 10 to about 100 microns; and
    selecting said ceramic particles of a larger size than said metallic particles.

3. The process of claim 2 further including the step of selecting said metallic material from the group consisting of aluminum, copper, nickel, titanium, chromium, iron, silver, gold and alloys thereof.

4. The process of claim 3 further including the step of selecting said ceramic material from the group consisting of $Al_2O_3$, AlN, SiC, BeO, $TiO_2$, $ZrO_2$, MgO, BN, $Si_3N_4$ and mixtures thereof.

5. The process of claim 4 further including the step of selecting said glass from the group consisting of silicate, borosilicate, lead borate, phosphate, lead-silicate, soda-lime-silica, lead-zinc-borate and zinc borosilicate glasses.

6. The process of claim 5 further including the step of selecting said glass binder having a softening temperature in the range of about 350° to about 1200° C.

7. The process of claim 6 further including the step of selecting said glass having a CTE of about $60 \times 10^{-7}$ to about $170 \times 10^{-7}$ in/in/°C.

8. The process of claim 7 further including the step of maintaining said compacted mixture at a temperature of about 600° to about 750° C. for a time of about 8 to about 100 hours.

9. An article of commerce in accordance with the process of claim 1.

10. An article of commerce in accordance with the process of claim 4.

11. The process of forming a composite material comprising the steps of:
    providing a mixture from about 25 to about 80 volume % of metallic material in the form of particles, from an effective amount up to about 10 volume % of binder in the form of particles of glass, and the balance essentially ceramic particles;
    mixing said particles of glass with said ceramic particles whereby said ceramic particles are coated with said glass particles;
    heating the glass coated ceramic particles to soften the glass;
    cooling the heated glass coated ceramic particles to fuse the glass to the ceramic particles;
    grinding the fused glass coated ceramic into particle form;
    mixing the glass coated ceramic particles with said metallic parrticles;
    compacting said mixture; and
    heat treating the compacted mixture to form a matrix comprising the metallic material with said glass coated ceramic particles distributed therein.

12. The process of claim 11 further including the steps of:
    selecting the metallic particles having a size from about 3 to about 100 microns;
    selecting said glass particles having a size from about 3 to about 25 microns;

selecting said ceramic particles having a size from about 10 to about 100 microns; and selecting said ceramic particles of a size which is greater than said metallic particles.

13. The process of claim 12 further including the step of selecting said metallic material from the group consisting of aluminum, copper, nickel, titanium, chromium, iron, silver, gold and alloys thereof.

14. The process of claim 13 further including the step of selecting said ceramic material from the group consisting of $Al_2O_3$, AlN, SiC, BeO, $TiO_2$, $ZrO_2$, MgO, BN, $Si_3N_4$ and mixtures thereof.

15. The process of claim 14 further including the step of selecting said glass from the group consisting of silicate, borosilicate, lead borate, phosphate, soda-lime-silica, lead-silicate, lead-zinc-borate and zinc borosilicate glasses.

16. The process of claim 15 further including the step of selecting said glass having a CTE of about $60 \times 10^{-7}$ to about $170 \times 10^{-7}$ in/in/°C.

17. The process of claim 16 further including the step of heat treating said compacted mixture at a temperature of about 600° to about 750° C. for a time of about 8 to about 100 hours.

18. An article of commerce in accordance with the process of claim 11.

19. A composite material comprising:

from about 25 to about 80 volume % of metallic material;

from an effective amount up to about 10 volume % of glass; and the balance essentially ceramic particles;

said glass bonding to both said metallic material and said ceramic particles resulting in said composite material having a matrix comprising said metallic material with glass coated ceramic particles distributed therein; and said ceramic particles being selected from the group consisting of $Al_2O_3$, $AlN_2$, SiC, BeO, $TiO_2$, $ZrO_2$, MgO, BN, $Si_3N_4$, and mixtures thereof.

20. The composite of claim 19 including said ceramic particles having a size from between about 10 to about 100 microns.

21. The composite of claim 20 further including said coating of glass being selected from the group consisting of silicate, borosilicate, lead borate, phosphate, soda-lime-silicate, lead-silicate, lead-zinc-borate and zinc borosilicate glasses.

22. The composite of claim 21 wherein said matrix with the glass coated ceramic particles distributed therein has a coefficient of thermal expansion of between about $140 \times 10^{-7}$ to about $170 \times 10^{-7}$ in/in/°C., a thermal conductivity of at least about 50 W/m-°K., and a compressive elastic modulus of at least about $20 \times 10^6$ psi.

23. The composite of claim 22 further including a substrate and a cover both formed of said composite;

a metallic leadframe; and a glass bonding said cover to said substrate with said leadframe therebetween to form a casing adapted to receive a semiconductor device.

24. A composite material comprising:

from about 25 to about 80 volume % of metallic material;

from an effective amount up to about 10 volume % of glass; and the balance essentilly ceramic particles;

said glass being coated about said ceramic particles; and said glass coated particles being blended with said metallic material so that said glass bonds to both said metallic material and said ceramic particles, resulting in said composite material having a matrix comprising said metallic material with glass coated ceramic particles distributed therein.

25. The composite of claim 24 further including said ceramic particles being selected from the group consisting of $Al_2O_3$, $AlN_2$, SiC, BeO, $TiO_2$, $ZrO_2$, MgO, BN, $Si_3N_4$, and mixtures thereof.

26. The composite of claim 25 including said ceramic particles having a size from between about 10 to about 100 microns.

27. The composite of claim 26 further including said coating of glass being selected from the group consisting of silicate, borosilicate, lead borate, phosphate, soda-lime-silicate, lead-silicate, lead-zinc-borate, and zinc borosilicate glasses.

28. The composite of claim 27 wherein said matrix with the glass coated ceramic particles distributed therein has a coefficient of thermal expansion of between about $140 \times 10^{-7}$ to about $170 \times 10^{-7}$ in/in/°C., a thermal conductivity of at least about 50 W/m-°K., and a compressive elastic modulus of at least about $20 \times 10^6$ psi.

29. The composite of claim 28 further including a substrate and a cover both formed of said composite;

a metallic leadframe; and a glass bonding said cover to said substrate with said leadframe therebetween to form a casing adapted to receive a semiconductor device.

* * * * *